Nov. 6, 1951 R. B. FOSTER 2,574,097

REMOTE CONTROL FOR RADIO RECEIVERS

Filed Aug. 21, 1946

Inventor
ROBERT B. FOSTER
By William E. Hall
Attorney

Patented Nov. 6, 1951

2,574,097

UNITED STATES PATENT OFFICE 2,574,097

REMOTE CONTROL FOR RADIO RECEIVERS

Robert B. Foster, Los Angeles, Calif., assignor to John B. Smiley, Washington, D. C.

Application August 21, 1946, Serial No. 691,895

4 Claims. (Cl. 250—20)

Figure 1:
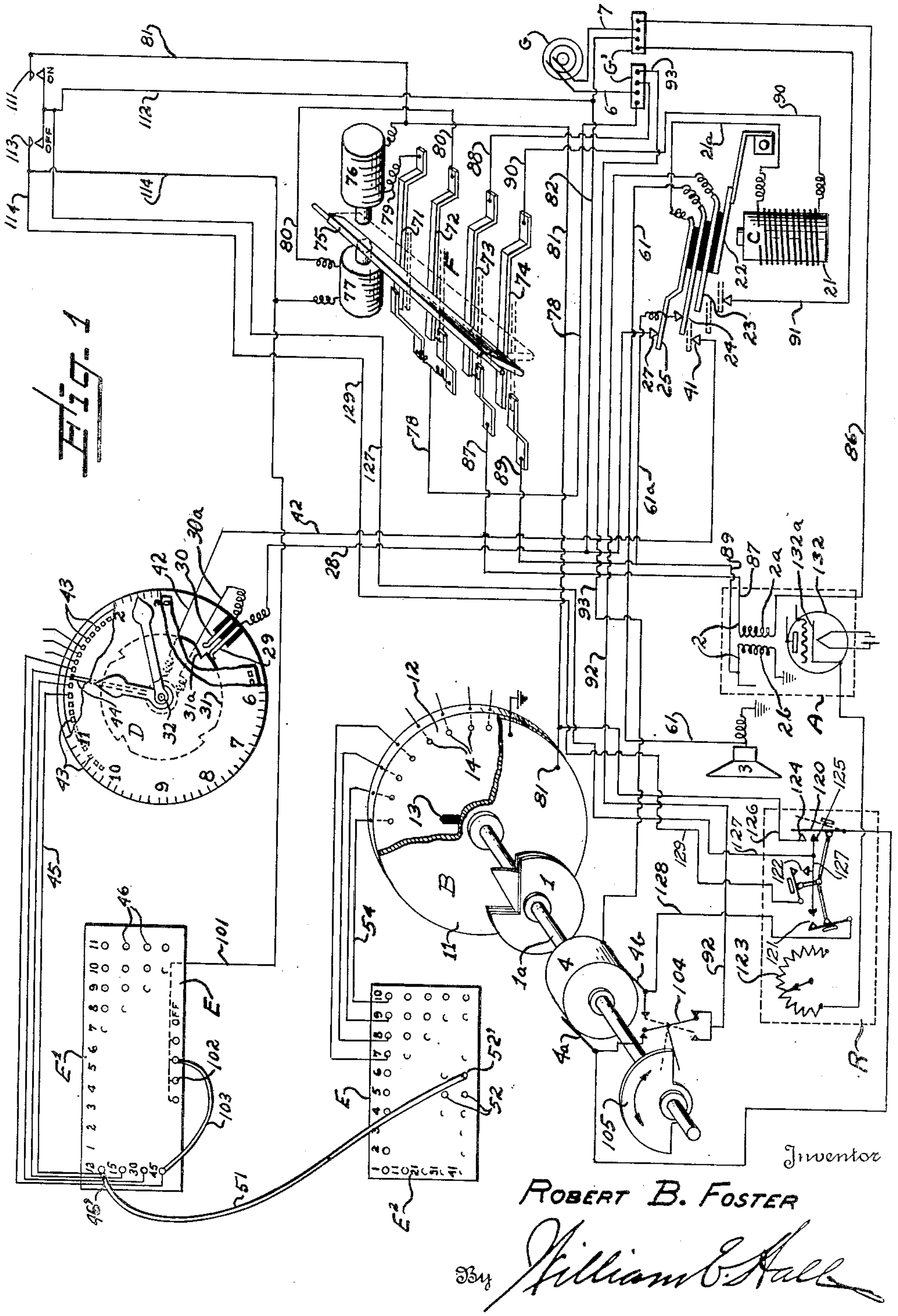

My present invention relates to a control apparatus for radio receivers, and more particularly to remote control apparatus therefor.

One of the principal objects of this invention is to provide, in connection with a radio receiver having a motor-controlled tuning condenser, a remote control whereby the rotation, or other movement, of the tuning condenser may be progressively operated in one direction by operating one button on the remote control, but which may be readily reversed as desired by operating a second button on the remote control apparatus, thereby permitting the tuning condenser to be operated rapidly and continuously in opposite directions as required in order to bring in the desired broadcast station.

Another important object of this invention is to provide a remote control apparatus for a radio receiver whereby the receiver may be controlled in all respects from a remote position from the receiver as the latter could be controlled when directly operated by the usual control buttons thereon.

An important object also of this invention is to provide on such remote control apparatus an effective volume control for the radio receiver.

A further important object of this invention is to provide a novel volume control for radio receivers whereby the volume of the loud-speaker may be easily and quickly controlled by only a slight movement of the volume control button or other device.

With these and other objects in view, as will appear hereinafter, I have devised a control apparatus for radio receivers having certain novel features of construction, combination, and arrangement of parts and portions, as will be hereinafter described in detail and particularly set forth in the appended claims, reference being had to the accompanying drawing and to the characters of reference thereon, which forms a part of this application and which is a diagrammatic view of a control apparatus in a preferred form, showing certain parts in perspective, fragmentarily, and partly broken away to facilitate the illustration.

My control apparatus, as shown in the drawing, although applicable to various radio receivers having a motor-operated tuning condenser, is here shown as connected to an automatic starting and control apparatus, for radio receivers, shown and claimed in one of my former United States patents, No. 2,209,084, issued July 23, 1940. The appended description will largely refer to the apparatus there disclosed.

The radio receiving set, designated A, shows only a rotary variable condenser 1, a transformer 2, and a loud-speaker 3. The shaft of the condenser is shown directly connected to an alternating current motor 4, which operates a selective tuning means or switch B.

The motor is controlled primarily by an electro-magnetic switch C at predetermined periods in accordance with a time switch element D, in accordance with the arrangement of a jack-board E. The starting and control of the receiver, although initiated by the time switch element D, is effected primarily by a multiple switch mechanism F.

As here shown, two leads from an alternating current generator G are connected to a multiple block G′, these leads being indicated as 6 and 7.

The selective tuning means B consists essentially of a rotary disc 11 and a concentric stationary disc 12, the former carrying an insulating strip 13 and the latter a plurality of electric contacts 14 spaced to correspond with the broadcast station spaces on the control dial (not shown) of the tuning condenser 1.

The electro-magnetic switch mechanism C comprises a magnet or coil 21 and an armature 22 which carries a plurality of three flexible switch members 23, 24, and 25, insulated from each other and from the armature. The latter switch member is permanently electrically connected, that is, when the switch 74 (described below) is closed, through the coil with a source of energy, which consists, in this instance, of the transformer 2. When the coil is deenergized, the member 25 normally engages a contact 27 which is connected by wire 28 with a brush 29 of the time switch D, which brush 29 normally engages the periphery of an insulating member, such as a fibre disc 31, mounted on the minute shaft 32 of a time switch D. This disc has four equal-arcuately spaced notches 31[a] into which the free end of the brush 29 may drop during the rotation of the disc. When the brush drops into a notch it engages a grounded finger 30. The grounding of the finger 30, however, is effected only at predetermined periods, as will be described hereafter. For this purpose, it is connected, by a wire 30[a], to an arm 44, mounted on but insulated (not shown) from the hour shaft of the time switch or clock D. Thus the circuit to the coil 21 is completed and the armature attracted, but energizing of the magnet instantly breaks the aforementioned circuit. Such energizing of the magnet causes the switch member 25 to engage another contact 41 which is connected by wire 42 to the switch arm 44, above mentioned.

The time switch or clock D carries a plurality of contacts 43 circumferentially elongated and circumferentially spaced about the axis of the clock. These contacts 43 form, with the contact arm 44, holding switches. Each of the contacts 43 is connected by a wire 45 to a separate jack 46′ in the portion $E^1$ of the jack-board E. This board is shown provided with one jack for each 15-minute interval.

The jacks 46 may be connected by cords 51 with jacks 52 on the portion $E^2$ of the board E. Each of the latter jacks is connected by a wire 54 to a separate contact 14 on the stationary disc 12. The disc 11 is grounded, and effects the ground previously referred to in connection with the finger 30. The other terminal of the transformer 2 is also grounded. Thus, at the designated time, and with the proper connections by the cords 51, the circuit will be continued through the magnet, holding the armature 22 in the attracted or dotted line position.

As the armature is attracted by the magnet, the loud-speaker 3 is disconnected by the switch member 24, which breaks the circuit 61 to the loud-speaker. At the same time the circuit from the generator G to the motor 4 is closed, as will be described hereafter. This rotates the disc 11 until the insulating strip 13 engages the contact 14 which corresponds to the broadcast station or tuning condenser marking desired and to which the condenser is moved by the motor.

The multiple switch mechanism F, illustrated, consists of spring switches 71, 72, 73, and 74, in which, when the radio receiver is off, the switch 71 is normally closed while the other switches are normally open. The condition of these switches is simultaneously reversed, that is, switch 71 is opened while the others are closed, by a rocking bar 75. The bar is rocked to opposite positions by an on-magnet 76 and an off-magnet 77. The former, when the radio receiver is turned on, reverses the switches from their normal positions, that is, it opens the switch 71 and closes switches 72, 73 and 74. The latter magnet 77 is the off-magnet and allows the switches to return to their normal positions.

One end of both switches 71 and 72 is connected by wire 78 to lead 6. The other ends of both switches are connected by wires 79 and 80, respectively, to one end of magnets 76 and 77. The other end of magnet 76 is connected by wire 81 to the revoluble disc 11 of the station-finder switch B. Since the two discs are in constant electrical connection, except as hereinafter described, a circuit will be established through the station-finder switch B and the time switch D at the time predetermined by the time switch. The circuit with the time switch D to the other lead 7 is completed by the wire 82 which is connected to the flexible finger 29 of the clock D.

The energized magnet 76, by the alternating current circuit just described, operates or reverses all of the switches, breaking such circuit through the switch 71 and the magnet 76. The closing of the switch 73 completes an alternating current circuit through wires 86, 87, and 88, energizing the primary $2^a$ of the transformer 2, which excites the secondary $2^b$.

The secondary is connected by wire 89 to the switch 74. Closing of the switch 74 also completes the circuit through the secondary and establishes a direct current through the wire 90, and, as described above, through the coil 21, wire $21^a$, flexible switch member 25, contact 27, of the magnetic switch C, wire 28, switch members 29 and 30 and the arm 44 and a contact 43 of the time switch D, one of each of the wires 45, jacks 46, cords 51, jacks 52, wires 54, and contacts 14, the latter on the stationary disc 12 of the station-finder switch B, and thence to the revoluble disc 11 which is grounded. The other direct current terminal of the transformer is also grounded, as described.

When the coil 21 is energized the switch member 25 engages the contact 41, sending a direct current through wire 42 to the arm 44, also through the switch 74, and thereby holding the armature 22 of the magnetic switch C.

The attraction of the armature 22 causes the switch member 24 to break the circuit through the wire 61 to the loud speaker 3, while the switch member 23 completes an alternating current circuit through the wires 91, 92, and 93, to the motor 4 which operates the condenser and the disc 11 of the station-finder switch B. The loud-speaker 3 and motor 4 are affected only indirectly by the switch 74 of the multiple switch F.

The return of the armature 22 breaks the motor circuit and again establishes the circuit through the loud-speaker 3.

The motor here used is a reversible or reversing motor having brushes $4^a$ and $4^b$, which are adapted alternately to be connected to the wire 92 connectible to the terminal block 7. This alternate connection is effected through a toggle switch 104, which is operated or reversed by a cam or segment 105 mounted on the motor shaft, or operatively connected to the motor. As the motor 4, which operates the station-finder switch B, is rotated to the full extent, the cam or segment 105 tilts or operates the toggle switch 104, causing the motor to be reversed, until the motor is rotated to the opposite extreme, when the toggle switch is again operated to reverse the motor.

When the switch 72 is closed, a circuit is established between lead 6, wire 78, and wire 80 to the "off" magnet 77. This magnet is connected by a wire 101 to a plurality of sockets or jacks 102, one or more of which are connected by cables 103 to the desired jack 46, which is connected to one of the contacts 43 of the timing switch D. At the desired or predetermined time, an alternating current is established through the clock, wire 82, and the alternating current lead 7.

If it is desired to dispense with the automatic feature applied to the radio receiving set, I have provided a button 111 which connects, by a wire 112, the lead 7 with the on-magnet 76. By an instant depression of the button, the on-magnet 76 is energized throwing the multiple switches to their "on" or reverse positions, and connecting the receiving set to the current.

If it is desired to dispense with the automatic shut-off, or if it is desired to turn off the radio receiving set at any time, a button 113 is depressed. This closes a circuit, through wires 114, off-magnet 77, and wire 78, to the alternating current line, rocking the bar 75 and returning the multiple switches to their normal off-positions, as shown by solid lines in Fig. 1.

My remote control is enclosed in a casing, indicated by dash outline and designated R. In this casing of the remote control apparatus are located switches 120, 121, 122, and a volume control device 123. The switches 120, 121, and 122, are contact or push button switches and may be referred to respectively as a direct motor-operating or "on" switch, a reversing switch, and an "off" switch.

The switch 120 is arranged to connect contacts 124 and 125, these being connected, respectively, by a wire 126 to the electro-magnet 76, and by the wire 127 to the wire 112 connected to the first mentioned "on" and "off" switches 111 and 113.

The reversing switch 121 is connected by wire 128 to the brush $4^b$ of the motor 4, and is adapted to connect this wire to the wire 127.

The switch 122 is connected by a wire 129 to the wire 114 connected to the "off" switch 113.

Thus, the radio receiving set may be remotely turned on by operating the "on" switch 120, and the holding of this switch operates the motor 4. This motor may be immediately reversed by operating the button 121. The whole radio may be shut off by operating the switch 122.

It will be here noted that the switches just mentioned are so arranged that none of them can operate simultaneously. They are mechanically connected by toggle links so that the "on" switch 120 is turned off when the reversing switch 121 is operated. Also when the "off" switch 122 is operated, the "on" switch 120 and reversing switch 121 cannot be operated. The "off" switch 122 is shown connected to each of the latter by pivotally connected links which, when aligned by shifting their connected ends, open the switches 120 and 121. These links, however, may be shifted substantially endwise for closing one of the latter when the other of the latter switches is opened.

As shown diagrammatically in the drawing, the links for operating the switches 120, 121, and 122, are pivotally connected at a common center, this center pivot being adapted to move in any direction in a plane. For example, when the link of the switch 120 is moved in a line which substantially bisects the switches 121 and 122, the links of the latter switches are spread apart to exert forces which open the switches 121 and 122, this condition being shown in the drawing. In a like manner, the links of the switches 120 and 122 are spread apart to open these latter switches when the link of the switch 121 is moved toward the right to close the switch 121. Likewise when the link for the switch 122 is moved toward the switches 120 and 121 to close the switch 122, the links of the switches 120 and 121 are spread apart to open the latter. In actual practice the switches 120, 121, and 122, may be equidistantly spaced and the actuating arms of the switches provided with over center springs which function to retain the switches in either open or closed condition. The resulting device is, in effect, a three-way toggle mechanism.

The volume of the loud-speaker in the receiving set may be operated in the usual manner, but is also operated from the remote control apparatus R. As shown, the volume control device 123 is connected by wire 131 to the cathode $132^a$ controlling the bias of a tube 132 in the intermediate frequency amplifier of a superheterodyne circuit. This tube is usually a 78 or 235 in such amplifier stage. Such connection to the cathode of the tube requires only a very limited movement of the volume control device.

Though I have shown and described a particular construction, combination, and arrangement of parts and portions, I do not wish to be limited to the same, but desire to include in the scope of my invention the construction, combination, and arrangement substantially as set forth in the appended claims.

I claim:

1. In a remote control apparatus for controlling the operation of a radio receiver having a rotary tuning element, a reversible electric motor drivingly connected to the tuning element for rotating the same, a first electric circuit including a first brush of said motor, said first circuit when energized effecting rotation of said motor and said tuning element in a first direction, a first switch in the first circuit for controlling the energization and deenergization thereof, a second electric circuit including a reversing brush of said motor, the second circuit when energized effecting rotation of the motor and the tuning element in a direction reverse to said first direction, a second switch in the second circuit for controlling the energization and deenergization thereof, said first and second switches being so arranged and interconnected that closing of either switch effects opening of the other switch, and a third switch disposed adjacent said tuning element and having a movable pole adapted when moved in a first direction to be connected in the first circuit to form part thereof and adapted when moved in a second direction to be connected in the second circuit to form part thereof, said pole being engageable and movable by said tuning element upon rotation thereof through a predetermined part of a full rotation in either direction to effect movement of said pole in one of said directions so as to open the particular circuit in which the pole is at the time connected, when said particular circuit is closed by one of said first or second switches, and to condition the other circuit for subsequent energization by the closing of the other switch of said last mentioned switches.

2. In a remote control apparatus for controlling the operation of a radio receiver having a rotary tuning element, a reversible electric motor drivingly connected to the tuning element for rotating the same, a casing disposed remotely from the receiver, a first electric circuit including a first brush of said motor, said first circuit when energized effecting rotation of said motor and said tuning element in a first direction, a first switch disposed in said casing and in the first circuit for controlling the energization and deenergization thereof, a second electric circuit including a reversing brush of said motor, the second circuit when energized effecting rotation of the motor and the tuning element in a direction reverse to said first direction, a second switch disposed in said casing and in the second circuit for controlling the energization and deenergization thereof, said first and second switches being so arranged and interconnected that closing of either switch effects opening of the other switch, and a third switch disposed adjacent said tuning element and having a movable pole adapted when moved in a first direction to be connected in the first circuit to form part thereof and adapted when moved in a second direction to be connected in the second circuit to form part thereof, said pole being engageable and movable by said tuning element upon rotation thereof through a predetermined part of a full rotation in either direction to automatically effect movement of said pole in one of said directions so as to open the particular circuit in which the pole is at the time connected, when said particular switch is closed by one of said first or second switches, and to condition the other circuit for subsequent energization by the closing of the other switch of said last mentioned switches.

3. In a remote control apparatus for controlling the operation of a radio receiver having a rotary tuning element, a reversible electric motor drivingly connected to the tuning element for rotating the same, a casing disposed remotely from the receiver, a first electric circuit including a first brush of said motor, said first circuit when energized effecting rotation of said motor and said tuning element in a first direction, a first switch disposed in said casing and in the first circuit for controlling the energization and deenergization thereof, a second electric circuit including a reversing brush of said motor, the second circuit when energized effecting rotation of the motor and the tuning element in a direction reverse to said first direction, a second switch disposed in said casing and in the second circuit for controlling the energization and deenergization thereof, said first and second switches being so arranged and interconnected that closing of either switch effects opening of the other switch, a third switch disposed adjacent said tuning element and having a movable pole adapted when moved in a first direction to be connected in the first circuit to form part thereof and adapted when moved in a second direction to be connected in the second circuit to form part thereof, said pole being engageable and movable by said tuning element upon rotation thereof through a predetermined part of a full rotation in either direction to automatically effect movement of said pole in one of said directions so as to open the particular circuit in which the pole is at the time connected, when said particular switch is closed by one of said first or second switches, and to condition the other circuit for subsequent energization by the closing of the other switch of said last mentioned switches, and a fourth switch disposed within the casing and interconnected with said first and second switches and adapted when actuated manually to open either said first or second switch, whichever is closed prior to actuation of the fourth switch, so as to effect discontinuation of the rotation of the motor and stopping of the tuning element at a selected position.

4. In a remote control apparatus for controlling the operation of a radio receiver having a rotary tuning element, a reversible electric motor drivingly connected to the tuning element for rotating the same, a casing disposed remotely from the receiver, a first electric circuit including a first brush of said motor, said first circuit when energized effecting rotation of said motor and said tuning element in a first direction, a first switch disposed in said casing and in the first circuit for controlling the energization and deenergization thereof, a second electric circuit including a reversing brush of said motor, the second circuit when energized effecting rotation of the motor and the tuning element in a direction reverse to said first direction, a second switch disposed in said casing and in the second circuit for controlling the energization and deenergization thereof, said first and second switches being so arranged and interconnected that closing of either switch effects opening of the other switch, a third switch disposed adjacent said tuning element and having a movable pole adapted when moved in a first direction to be connected in the first circuit to form part thereof and adapted when moved in a second direction to be connected in the second circuit to form part thereof, said pole being engageable and movable by said tuning element upon rotation thereof through a predetermined part of a full rotation in either direction to automatically effect movement of said pole in one of said directions so as to open the particular circuit in which the pole is at the time connected, when said particular switch is closed by one of said first or second switches, and to condition the other circuit for subsequent energization by the closing of the other switch of said last mentioned switches, a fourth switch disposed within the casing and interconnected with said first and second switches and adapted when actuated manually to open either said first or second switch, whichever is closed prior to actuation of the fourth switch, so as to effect discontinuation of the rotation of the motor and stopping of the tuning element at a selected position, and a master switch adapted when closed to permit energization of either of said circuits.

ROBERT B. FOSTER.

REFERENCES CITED

The following references are of record in the file of this patent:

UNITED STATES PATENTS

| Number | Name | Date |
|---|---|---|
| 1,523,403 | Cope | Jan. 20, 1925 |
| 1,552,829 | De Bellescize | Sept. 8, 1925 |
| 1,911,021 | Gunther | May 23, 1933 |
| 1,930,029 | Alden | Oct. 10, 1933 |
| 1,931,656 | Hatch | Oct. 24, 1933 |
| 1,971,811 | Chadbourne | Aug. 28, 1934 |
| 2,153,969 | McCutchen | Apr. 11, 1939 |
| 2,174,566 | Case | Oct. 3, 1939 |
| 2,209,084 | Foster | July 23, 1940 |
| 2,263,989 | Hill et al. | Nov. 25, 1941 |
| 2,297,470 | Guarnieri | Sept. 29, 1942 |
| 2,318,338 | Simon et al. | May 4, 1943 |
| 2,383,338 | Newman | Aug. 21, 1945 |
| 2,426,580 | O'Brien | Aug. 26, 1947 |